United States Patent
Weller et al.

(10) Patent No.: US 9,588,207 B2
(45) Date of Patent: Mar. 7, 2017

(54) SYSTEM FOR RECONSTRUCTING MRI IMAGES ACQUIRED IN PARALLEL

(75) Inventors: Daniel Weller, Ann Arbor, MI (US);
Leo Grady, Millbrae, CA (US);
Lawrence Wald, Cambridge, MA (US);
Vivek K Goyal, Cambridge, MA (US)

(73) Assignees: National Institutes of Health (NIH), U.S. Dept. of Health and Human Services (DHHS), The United States of America NIH Division of Extramural Inventions and Technology Resources (DEITR), Washington, DC (US); Siemens Healthcare GmbH, Erlangen (DE)

( * ) Notice: Subject to any disclaimer, the term of this patent is extended or adjusted under 35 U.S.C. 154(b) by 1184 days.

(21) Appl. No.: 13/615,785

(22) Filed: Sep. 14, 2012

(65) Prior Publication Data

US 2013/0088225 A1    Apr. 11, 2013

Related U.S. Application Data

(60) Provisional application No. 61/543,909, filed on Oct. 6, 2011.

(51) Int. Cl.
*G01R 33/341* (2006.01)
*G01R 33/58* (2006.01)
*G01R 33/561* (2006.01)

(52) U.S. Cl.
CPC ................. *G01R 33/5611* (2013.01)

(58) Field of Classification Search
CPC ............ G01R 33/5611; G01R 33/5612; G01R 33/3415

(Continued)

(56) References Cited

U.S. PATENT DOCUMENTS

| 8,692,549 B2* | 4/2014 | Grady ............... G01R 33/5611 |
| | | 324/307 |
| 2009/0256570 A1* | 10/2009 | Zelinski ............ G01R 33/4836 |
| | | 324/314 |

(Continued)

OTHER PUBLICATIONS

P.B. Roemer, et al., "The NMR Phased Array", Magnetic Resonance in Medicine 16, 192-225 (1990).

(Continued)

*Primary Examiner* — Melissa Koval
*Assistant Examiner* — Rishi Patel

(57) ABSTRACT

A system for parallel image processing in MR imaging comprises multiple MR imaging RF coils for individually receiving MR imaging data representing a slice of patient anatomy. An MR imaging system uses the multiple RF coils for acquiring corresponding multiple image data sets of the slice. An image data processor comprises at least one processing device conditioned for, deriving a first set of weights for generating a calibration data set comprising a subset of k-space data of composite image data representing the multiple image data sets. The at least one processing device uses the calibration data set in generating a first MR image data set, deriving a second set of weights using the calibration data set and the generated first MR image data set and uses the second set of weights in generating a second MR image data set representing a single image having a reduced set of data components relative to the first composite MR image data set.

18 Claims, 6 Drawing Sheets

(58) Field of Classification Search
USPC .................. 324/307, 309, 318, 322; 382/131
See application file for complete search history.

(56) References Cited

U.S. PATENT DOCUMENTS

| | | | | |
|---|---|---|---|---|
| 2009/0262996 | A1* | 10/2009 | Samsonov | G01R 33/4818 382/130 |
| 2010/0308824 | A1* | 12/2010 | Grady | G01R 33/5611 324/309 |
| 2012/0081114 | A1* | 4/2012 | Weller | G01R 33/5611 324/309 |
| 2012/0092009 | A1 | 4/2012 | Zhang et al. | |

OTHER PUBLICATIONS

Klaas P. Pruessmann, et al., "SENSE: Sensitivity Encoding for Fast MRI", Magnetic Resonance in Medicine 42:952-962 (1999).

Mark a Griswold, et al., "Generalized Autocalibrating Partially Parallel Acquisitions (GRAPPA)", Magnetic Resonance in Medicine 47:1202-1210 (2002).

Daniel K. Sodickson, et al, "Simultaneous Acquisition of Spatial Harmonics (SMASH): Fast Imaging with Radiofrequency Coil Arrays", MRM 38:591-603 (1997).

Fa-Hsuan Lin, et al., "Parallel Imaging Reconstruction Using Automatic Regularization", Magnetic Resonance in Medicine 51:559-567 (2004).

Mark Bydder, et al., "A nonlinear regularization strategy for GRAPPA calibration", Magnetic Resonance Imaging 27 (2009) 137-141.

Peter M. Jakob, et al., "AUTO-SMASH: A self-calibrating technique for SMASH imaging", Magnetic Resonance Materials in Physics. Biology and Medicine 7 (1998) 42-54.

Anja C.S. Brau, et al., "Comparison of Reconstruction Accuracy and Efficiency Among Autocalibrating Data-Driven Parallel Imaging Methods", Magnetic Resonance in Medicine 59:382-395 (2008).

Michael Lustig, et al., "Sparse MRI: The Application of Compressed Sensing for Rapid MR Imaging", Magnetic Resonance in Medicine 58:1182-1195 (2007).

Robert Tibshirani, "Regression Shrinkage and Selection via the Lasso", Journal of the Royal Statistical Society, Series B (Methodological), vol. 58, issue 1 (1996), 267-288.

Daniel S. Weller, et al., "Evaluating Sparsity Penalty Functions for Combined Compressed Sensing and Parallel MRI", Biomedical Imaging: From Nano to Macro, 2011 IEEE International Symposium on , vol., No., pp. 1589-1592, Mar. 30, 2011-Apr. 2, 2011.

D. S. Weller, et al., "SpRING: Sparse Reconstruction of Images using the Nullspace method and GRAPPA", Proc. Intl. Soc. Mag. Reson. Med. 19 (2011).

Zhang T, Lustig M, Vasanawala S, and Pauly JM. "l1-denoised Autocalibrating Parallel Imaging." Proc. ISMRM 18th Scientific Meeting. Stockholm, Sweden, May 2010, p. 4883.

M.A. Bernstein, et al., Handbook of MRI Pulse Sequences, book review, NMR in Biomedicine, NMR Biomed. 2005; 18:202-203.

Andrey Nitlkhonov et al, "Solutions of ILL-Posed Problems", Winston, distributed solely by Halsted Press, Washington/New York (1977) 16 pages.

* cited by examiner

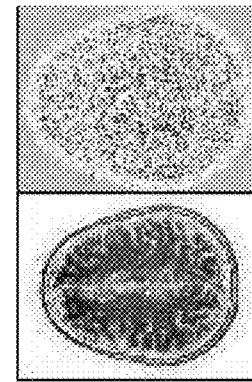
FIG. 3(c) GRAPPA+sparsity ($\lambda = 10^{0.4}$)
PSNR = 28.0 dB
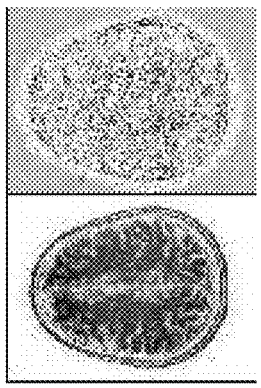
FIG. 3(b) GRAPPA+Tikhonov ($\alpha^2 = 0.1$)
PSNR = 28.1 dB
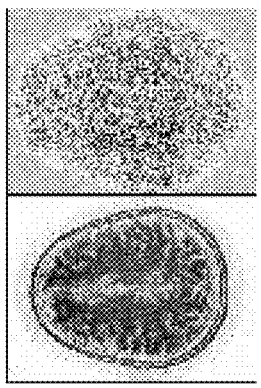
FIG. 3(a) GRAPPA
PSNR = 25.9 dB

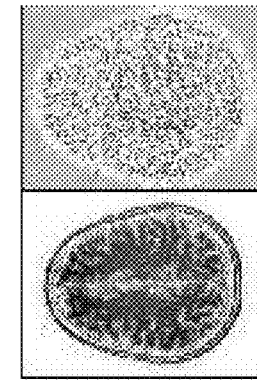
FIG. 4(c) GRAPPA+sparsity
($\lambda = 1$)
PSNR = 28.4 dB
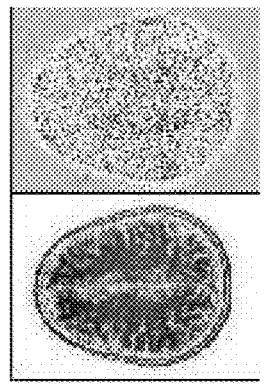
FIG. 4(b) GRAPPA+Tikhonov
($\alpha^2 = 10^{-1.2}$)
PSNR = 28.2 dB
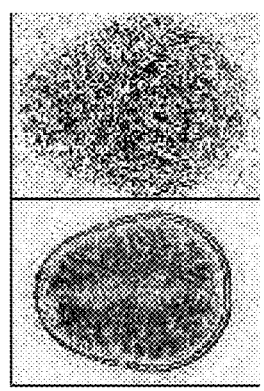
FIG. 4(a) GRAPPA
PSNR = 22.2 dB

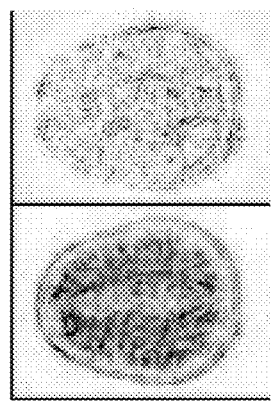
FIG. 5 (b) GRAPPA+sparsity ($\lambda = 10^{-0.8}$)
PSNR = 25.2 dB
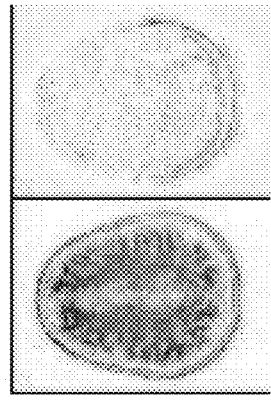
FIG. 5 (a) GRAPPA+Tikhonov ($\alpha^2 = 10^{0.2}$)
PSNR = 21.1 dB

SYSTEM FOR RECONSTRUCTING MRI IMAGES ACQUIRED IN PARALLEL

This is a non-provisional application of provisional application Ser. No. 61/543,909 filed 6 Oct. 2011, by D. Weller et al.

FIELD OF THE INVENTION

This invention concerns a system for parallel image processing in MR imaging by using a second set of weights in generating a second MR image data set representing a single image having a reduced set of data components relative to a first composite MR image data set derived using a first set of weights and a generated calibration data set comprising a subset of k-space data.

BACKGROUND OF THE INVENTION

Known systems for generating an image from parallel MR images acquired by multiple RF coils provide reduced quality images and are relatively slow. A system according to invention principles addresses this deficiency and related problems.

SUMMARY OF THE INVENTION

A system accelerates magnetic resonance (MR) imaging using compressed sensing (CS) combined with GRAPPA (Generalized autocalibrating partially parallel acquisitions), a parallel imaging method, to reconstruct images from highly undersampled data with significantly improved error (e.g. root-mean-squared error (RMSE)) compared to reconstructions using GRAPPA alone. A system for parallel image processing in MR imaging comprises multiple MR imaging RF coils for individually receiving MR imaging data representing a slice of patient anatomy. An MR imaging system uses the multiple RF coils for acquiring corresponding multiple image data sets of the slice. An image data processor comprises at least one processing device conditioned for, deriving a first set of weights for generating a calibration data set comprising a subset of k-space data of composite image data representing the multiple image data sets. The at least one processing device uses the calibration data set in generating a first MR image data set, deriving a second set of weights using the calibration data set and the generated first MR image data set and uses the second set of weights in generating a second MR image data set representing a single image having a reduced set of data components relative to the first composite MR image data set.

BRIEF DESCRIPTION OF THE DRAWING

FIG. 3 shows combined magnitude and difference images acquired with a first set of acquisition parameters and generated using GRAPPA reconstruction with (a) no regularization, (b) Tikhonov (minimum energy) regularization, and (c) sparsity-promoting regularization, according to invention principles.

FIG. 4 shows combined magnitude and difference images acquired with a second set of acquisition parameters and generated using GRAPPA reconstruction with (a) no regularization, (b) Tikhonov (minimum energy) regularization, and (c) sparsity-promoting regularization, according to invention principles.

FIG. 5 shows combined magnitude and difference images acquired with a third set of acquisition parameters and generated using GRAPPA reconstruction with (a) Tikhonov (minimum energy) regularization and (b) sparsity-promoting regularization, according to invention principles.

DETAILED DESCRIPTION OF THE INVENTION

Figure 1:
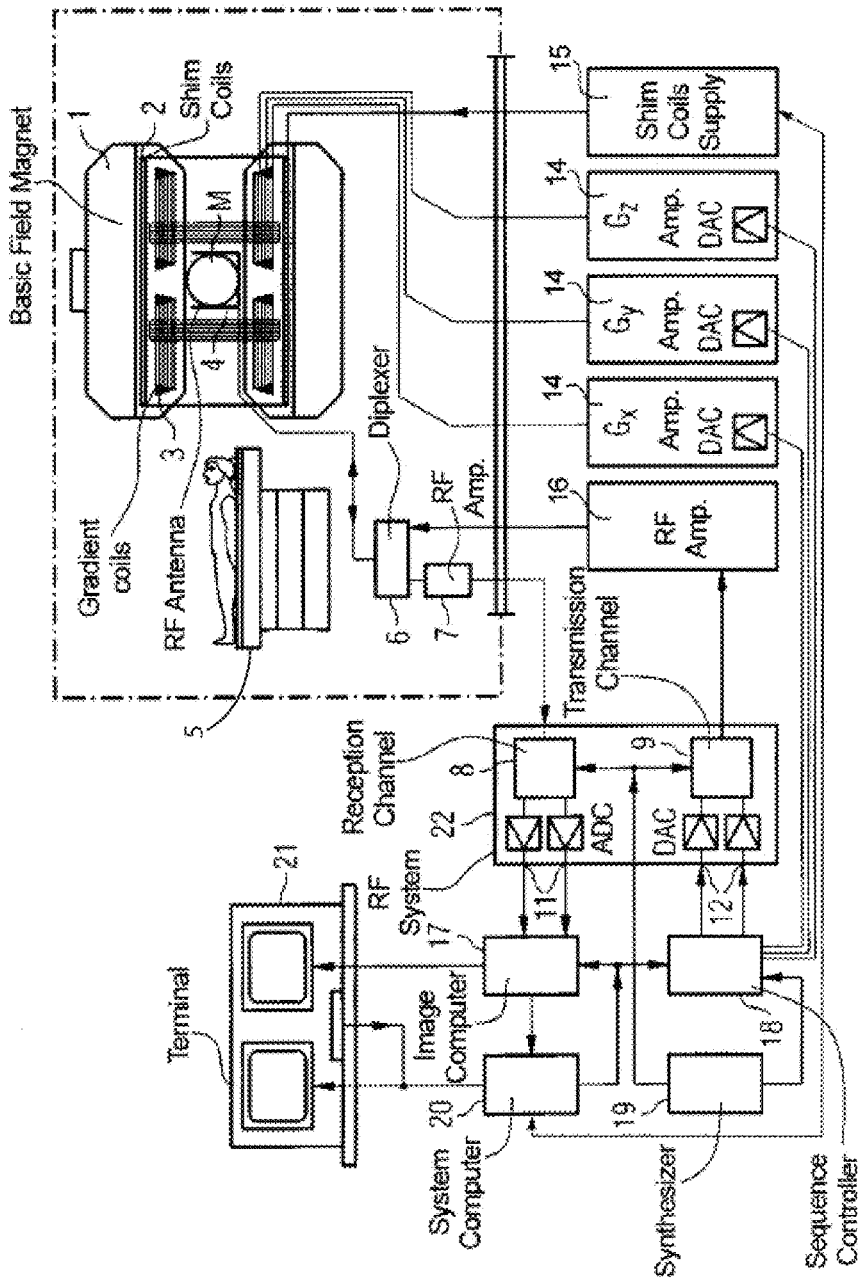
FIG. 1 shows a system for parallel image processing in MR imaging, according to invention principles.

A system accelerates magnetic resonance (MR) imaging using compressed sensing (CS) combined with GRAPPA, a parallel imaging method, to reconstruct images from highly undersampled data with significantly improved error (RMSE) compared to reconstructions using GRAPPA alone. This combination of GRAPPA and CS uses CS to find a better GRAPPA kernel by using a simultaneous sparsity penalty function of the coil images. This method is implemented by formulating the problem as a joint optimization of the least squares fit of a kernel to the ACS lines and the sparsity of the images generated using GRAPPA with the kernel. The system reconstructs quality images from a highly undersampled parallel acquisition with multiple coils. The system includes a computational device (e.g., computer, laptop, DSP (digital signal processor), tablet, cellphone) that receives acquired data from each RF coil of an MR imaging system and integrates the data to produce a reconstructed image. A reconstructed image is displayed to a user and saved to an electronic storage device (e.g., a hard drive).

Cartesian magnetic resonance imaging (MRI) involves sampling a three dimensional (3D) spatial Fourier transform (k-space) by encoding trajectories corresponding to lines parallel to a "readout" direction in a uniformly spaced 2-D grid on a transverse plane, containing orthogonal "phase-encode" directions. The acquisition time is proportional to the number and extent of the encoded k-space lines. The acquisition time is not affected by the sample spacing in the readout direction, since the sample spacing along the lines does not affect the total k-space trajectory length. Conventional imaging is limited by a tradeoff between spatial resolution, image size (field of view), signal-to-noise ratio (SNR), and acquisition time. For a $X \times Y \times Z$ mm$^3$ volume divided into voxels of $\Delta x \times \Delta y \times \Delta z$ mm$^3$, with a $k_x$ readout direction, the time T is proportional to $$T \propto N_{avg} \frac{YZ}{\Delta x \Delta y \Delta z}, \quad (1)$$

and the SNR is proportional to $$SNR \propto \sqrt{N_{avg} \Delta x \Delta y \Delta z}. \quad (2)$$

Image size is related to spacing between k-space samples, e.g. $X = 1/\Delta k_x$. The spatial resolution is inversely proportional to the sampled k-space extent, e.g. $\Delta x \approx 1/(2k_{x,max})$. Multiple different methods may be used to reduce image acquisition time, including: (1) reducing the extent of k-space that is sampled, resulting in lower spatial resolution; (2) increasing the spacing between phase-encode lines, resulting in a smaller field of view and aliasing in the image domain if an object is too large, or (3) averaging fewer repetitions, decreasing the SNR of the result. Since a specific image resolution and noise level are required to resolve features of interest in most applications, the acquisition may be accelerated by reducing the field of view in the phase-encode directions (i.e. sampling k-space below the Nyquist spacing $\Delta k_x \times \Delta k_y \times \Delta k_z$ for the imaged object) and utilizing accelerated parallel imaging to recover un-aliased images. The system improves GRAPPA accelerated parallel imaging using a sparsity-regularized calibration step.

Rather than use a single uniform RF receiver coil to acquire k-space data, the system uses the nonuniform characteristics of an RF receive coil array to concurrently acquire a set of spatially weighted images. The spatial variation of the sensitivities of these RF coils acts like an additional source of spatial encoding. If these sensitivities are known exactly, and the number of RF coils P is not less than the total undersampling factor R, SENSE (SENSitivity Encoding) is able to recover an un-aliased image via inversion of a linear system. Alternatively, a SMASH (SiMultaneous Acquisition of Spatial Harmonics) theoretical model suggests linear combinations of coil sensitivities approximate complex exponentials, which modulate the image to form frequency-shifted k-space. A missing k-space frequency can be estimated from a linear combination of samples of a neighboring k-space frequency across coils. When coil sensitivity measurements are unavailable, both AUTO-SMASH and GRAPPA compute the coefficients used for forming these complex exponentials by fitting a set of Nyquist-sampled calibration data, called autocalibration signal (ACS) lines. GRAPPA goes further by estimating a missing k-space frequency from multiple neighboring k-space locations. Also unlike SENSE and SMASH, which reconstruct an un-aliased image (or k-space) for an object, GRAPPA fills the missing k-space locations in each coil separately, leaving the final combination of fully sampled k-space as a post-processing step. This combination can be achieved using a root-sum-squares combination of the coil images or using another method.

GRAPPA calibrates a set of weights used for estimating target (missing) k-space frequencies from neighboring source (acquired) k-space points by fitting those weights to a set of ACS lines. For 2-D accelerated 3D GRAPPA, various methods may be used for calibrating a kernel. The system inverse transforms acquired MR signal data of a 3D volume along the readout (fully-sampled) direction into slices of 2-D k-space, and each slice is calibrated and reconstructed separately. A limitation of this method is that it provides a small set of ACS lines for calibration, since the ACS lines occupy only a small region of a transverse plane, to limit the additional overhead of encoding these lines. A 2-D GRAPPA reconstruction equation used to derive kernel fit equations comprises, $$y_q[k_y + r_y, k_z + r_z] = \sum_{p=1}^{P} \sum_{b_y=1}^{B_y} \sum_{b_z=1}^{B_z} g_{p,q,r_y,r_z}[b_y, b_z] \quad (3)$$
$$y_p\left[k_y + \left(b_y - \left\lceil\frac{B_y}{2}\right\rceil\right)R_y, k_z + \left(b_z - \left\lceil\frac{B_z}{2}\right\rceil\right)R_z\right],$$

where $y_p[k_y,k_z]$ is the k-space value at frequency $[k_y,k_z]$ in the pth coil, the GRAPPA kernel $g_{p,q,r_y,r_z}$ maps $B_y \times B_z$ source points uniformly spaced $R_y \times R_z$ apart from the pth coil to a target point frequency offset of $[r_y,r_z]$ in the qth coil's k-space. Since this reconstruction operation can be expressed as a convolution over acquired data $[R_y k_y, R_z k_z]$, the GRAPPA reconstruction operation has the advantage of being computationally efficient even for large datasets.

Substituting points from ACS lines $y^{ACS}$ for the data on both sides of Equation (3), a fit equation is formed for calibrating the GRAPPA kernel $g_{p,q,r_y,r_z}$:

$$y_q^{ACS}[k_y + r_y, k_z + r_z] = \sum_{p=1}^{P} \sum_{b_y=1}^{B_y} \sum_{b_z=1}^{B_z} g_{p,q,r_y,r_z}[b_y, b_z] \quad (4)$$
$$y_p^{ACS}\left[k_y + \left(b_y - \left\lceil\frac{B_y}{2}\right\rceil\right)R_y, k_z + \left(b_z - \left\lceil\frac{B_z}{2}\right\rceil\right)R_z\right].$$

Each kernel has $B_y B_z$ weights, so the above equation has $B_y B_z P$ unknowns, thus, assuming enough ACS lines, a least-squares fit can be performed for the kernel weights from at least $B_y B_z P$ fit equations. The total area of source and target points for a single ACS fit is $\max((B_y-1)R_y+1,R_y) \times \max((B_z-1)R_z+1,R_z)$, so if the ACS lines cover a region of size $N_{ACS,k_y} \times N_{ACS,k_z}$, the total number of fits is $$N_{fits} = (N_{ACS,k_y} - \max(B_y-1,1)R_y)(N_{ACS,k_z} - \max(B_z-1,1)R_z). \quad (5)$$

Collecting the ACS line points on the left and right sides of Eq. (4) for all $N_{fits}$ fit equations yields the least-squares optimization problem $$G = \underset{G}{\operatorname{argmin}} \|Y_{src}^{ACS} G - Y_{trg}^{ACS}\|_F^2, \quad (6)$$

where each column of G is the set of GRAPPA kernels $\{g_{p,q,r_y,r_z}: p \in \{1, \ldots, P\}\}$ for the target offset of $[r_y,r_z]$ in the qth coil, each row of $Y_{trg}^{ACS}$ and $Y_{src}^{ACS}$ represent the target points and source points for a fit from a different subset of the ACS lines, and $\|\cdot\|_F$ is the Frobenius norm. The solution of Eq. (6) is the calibrated set of GRAPPA kernels $$G = ((Y_{src}^{ACS})^H (Y_{src}^{ACS}))^{-1} (Y_{src}^{ACS})^H Y_{trg}^{ACS}, \quad (7)$$

where $[\cdot]^H$ is the complex conjugate transpose. When there are insufficient fit equations ($N_{fits} < B_y B_z P$), the matrix $(Y_{src}^{ACS})^H (Y_{src}^{ACS})$ is rank-deficient, and the calibrated kernel may not be correct.

Assuming the measurement noise in the ACS lines obeys the central) limit theorem, the matrices $(Y_{src}^{ACS})^H (Y_{src}^{ACS})$ and $(Y_{src}^{ACS})^H (Y_{trg}^{ACS})$ are influenced less by that noise as the number of fits increases, and the calibrated kernel more accurately represents actual frequency shifts. Conversely, as the number of fits decreases, the calibrated kernel fits the noise more, and the resulting reconstruction quality degrades. An improperly calibrated kernel can increase both noise amplification and coherent aliasing in a GRAPPA result. To counteract the poor fit when $N_{fits}$ is small, several regularization methods may be used.

One regularization method, known as Tikhonov regularization, has been applied successfully to SENSE. Similarly, this type of regularization can be applied to the GRAPPA kernel computation in Eq. (6):

$$G = \underset{G}{\operatorname{argmin}} \frac{1}{N_{Fro}} \|Y_{src}^{ACS} G - Y_{trg}^{ACS}\|_F^2 + \alpha^2 \|\Gamma vec(G - G_0)\|_2^2, \quad (8)$$

where $N_{Fro} = \min(R_y R_z - 1, B_y B_z) P$ is a normalization constant for the Frobenius norm, $\Gamma$ and G0 together represent prior information about the kernel, vec(•) stacks the columns of a matrix into a vector, and the tuning parameter α>0 balances the fidelity to the observations with the prior information. The system in one embodiment, imposes a minimum energy on the kernel, using Γ=I, and $G_0$=0. The solution to this optimization problem is $$G = \left( \frac{(Y_{src}^{ACS})^H (Y_{src}^{ACS})}{N_{Fro}} + \alpha^2 I \right)^{-1} (Y_{src}^{ACS})^H Y_{trg}^{ACS}. \tag{9}$$

Another method uses the interpretation of a GRAPPA kernel as performing a frequency shift and constrains the kernel by applying the kernel multiple times for output matching shifted original data. The system in one embodiment, regularizes the GRAPPA kernel calibration by promoting the sparsity of the resulting GRAPPA reconstruction, in the appropriate transform domain. The first regularization approach is largely used for comparison with a system method, as it has a closed-form solution.

FIG. 1 shows system 10 for parallel image processing in MR imaging. A basic field magnet 1 generates a strong magnetic field, which is constant in time, for the polarization or alignment of the nuclear spins in the examination region of an object, such as, for example, a part of a human body to be examined on automated movable patient support table 5. The automated patient support table 5 is controlled by system computer 20. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

Imaging computer 17 reconstructs an image from processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

A system for parallel image processing in MR imaging system 10 includes multiple MR imaging RF coils 4 for individually receiving MR imaging data representing a slice of patient anatomy. MR imaging system 10 uses multiple RF coils 4 for acquiring corresponding multiple image data sets of the slice. In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. An image data processor (in imaging computer 17) comprises at least one processing device conditioned for, deriving a first set of weights for generating a calibration data set comprising a subset of k-space data of composite image data representing the multiple image data sets. The image data processor uses the calibration data set in generating a first MR image data set, derives a second set of weights using the calibration data set and the generated first MR image data set and uses the second set of weights in generating a second MR image data set representing a single image having a reduced set of data components relative to the first composite MR image data set.

The system in one embodiment, regularizes the GRAPPA kernel calibration using sparsity with half-quadratic minimization and an iterative least-squares solver. At high image data processing accelerations, the GRAPPA result displays significant noise amplification, which can be mitigated via post-processing the GRAPPA result for de-noising. Since a wide variety of MRI data is sparse in generic transform domains like the discrete wavelet transform (DWT), and the noise amplified by GRAPPA retains its incoherence in the image and wavelet domains, sparsity-based regularization is a prime candidate for regularization. Using compressed sensing (CS), a signal with sufficient transform sparsity can be recovered from noisy undersampled data given a suitable measurement matrix and nonlinear reconstruction method. However, in contrast to conventional applications of CS, the system employs encoding that is not random but rather is uniformly undersampled Fourier encoding, which can introduce aliasing. System 10 employs ACS lines to constrain our GRAPPA kernel appropriately and mitigate aliasing. In addition, MRI datasets are not guaranteed to be strictly sparse, although most datasets are compressible; thus, care is taken not to over-sparsify a result, which otherwise would sacrifice image resolution.

The SpRING (GRAPPA) method utilizes a simultaneous sparsity penalty on the magnitude of the DWT of the images across the coils in conjunction with a GRAPPA fidelity term to de-noise resultant image data. However, due to the post-processing nature of the SpRING method, the inventors have recognized it does not confront the source of the noise amplification, the GRAPPA kernel. System 10 in one embodiment, advantageously uses sparsity regularization in a GRAPPA kernel calibration step, to produce a kernel that produces limited noise amplification.

A convex $l_1$ norm is used to promote sparsity, and a hybrid $l_{1,2}$ norm is used to promote simultaneous sparsity:

$$\|W\|_{1,2} = \sum_{n=1}^{N} \|[W_{n,1}, \ldots, W_{n,P}]\|_2, \tag{10}$$

where the pth column of W is the sparse transform representation of the image from the pth coil. For convenience, G is arranged so that each column contains the weights for a given output coil (G is now a $B_y B_z P(R_y R_z - 1) \times P$ matrix), and $Y_{src}^{ACS}$ and $Y_{trg}^{ACS}$ is rearranged appropriately. Using the sparsity of the GRAPPA reconstruction as a regularizer, Eq. (6) becomes $$G = \underset{G}{\operatorname{argmin}} \frac{1}{N_{Fro}} \|Y_{src}^{ACS} G - Y_{trg}^{ACS}\|_F^2 + \lambda \|\Psi F^{-1} f(G, Y^{acq})\|_{1,2}, \tag{11}$$

where λ is a tuning parameter, Ψ is the sparsifying transform, $F^{-1}$ is the inverse Fourier transform, $f(G, Y^{acq})$ is the GRAPPA reconstruction given the set of GRAPPA kernels G and acquired data (including ACS lines) $Y^{acq}$. Since the GRAPPA reconstruction operation is a convolution between the kernel and the data, the function $f(G, Y^{acq})$ is an affine function of G and $f^*(\cdot, Y^{acq})$ is its adjoint with respect to G. Since the adjoint of a convolution operation is convolution by the time-reversed conjugate of the convolution kernel, the adjoint is similarly easy to compute.

In order to solve the convex optimization problem in Eq. (11), a half-quadratic minimization is used in one embodiment comprising an iterative method to solve certain types of optimization problems and replaces the $l_{1,2}$ sparsity term with a weighted least-squares term, with the weights determined by the derivative of the penalty function. Since the $l_{1,2}$ function is not differentiable at the origin, the $l_{1,2}$ norm is replaced with a smoothed relaxation $$\|W\|_{1,2} \approx \sum_{n=1}^{N} \|[W_{n,1}, \ldots, W_{n,P}, \varepsilon]\|_2,$$

for small $\varepsilon > 0$. Each iteration of half-quadratic minimization requires solving the least-squares problem $$G = \underset{G}{\operatorname{argmin}} \frac{1}{N_{Fro}} \|Y_{src}^{ACS} G - Y_{trg}^{ACS}\|_F^2 + \frac{\lambda}{2} \|(\Delta^t)^{1/2} \Psi F^{-1} f(G, Y^{acq})\|_F^2, \quad (12)$$

where $\Delta_{n,n}{}^t = 1/\|[W_{n,1}{}^{t-1}, \ldots, \varepsilon]\|_2$ is a diagonal matrix, and $W^{t-1} = \Psi F^{-1} f(G^{t-1}, Y^{acq})$ is the sparse transform of the coil GRAPPA reconstructed images using the previous iteration's GRAPPA kernel set.

Differentiating Eq. (12) yields $$\frac{2}{N_{Fro}} (Y_{src}^{ACS})^H (Y_{src}^{ACS} G - Y_{trg}^{ACS}) + \quad (13)$$

$$\frac{\lambda}{N} f^* (F\Psi^H \Delta^t \Psi F^{-1} f(G, Y^{acq}), Y^{acq}) = 0.$$

For typical MRI datasets, this least-squares problem is too large to solve directly, so an iterative method called LSMR (an iterative solver for least-squares problems) is used. This program improves upon LSQR (A method for sparse linear equations and least square problems) by ensuring the residual norm of the system of normal equations for the least squares problem decreases monotonically and not just the residual norm of the original least-squares system. As for LSQR, to solve the linear system $Ax=b$, LSMR limits requirements to computation A and $A^H$ times a vector. For this example, using a vectorized version of the GRAPPA kernel set G as x, $$A = \begin{bmatrix} \sqrt{\frac{2}{N_{Fro}}} (I_P \otimes Y_{src}^{ACS}) \\ \sqrt{\lambda} (I_P \otimes ((\Delta^t)^{1/2} \Psi F^{-1} Y_{conv}^{acq})) \end{bmatrix}, \quad (14)$$

$$A = \begin{bmatrix} \sqrt{\frac{2}{N_{Fro}}} (I_P \otimes (Y_{src}^{ACS})^H) & \frac{\sqrt{\lambda}}{N} (I_P \otimes ((Y_{conv}^{acq})^H F \Psi^H (\Delta^t)^{1/2})) \end{bmatrix} \quad (15)$$

and $$b = \begin{bmatrix} \sqrt{\frac{2}{N_{Fro}}} \operatorname{vec}(I_P \otimes Y_{trg}^{ACS}) \\ -\sqrt{\lambda} (I_P \otimes ((\Delta^t)^{1/2} \Psi F^{-1})) \operatorname{vec}(Y_{fixed}^{acq}) \end{bmatrix}, \quad (16)$$

where $f(G, Y^{acq}) = Y_{conv}{}^{acq} G + Y_{fixed}{}^{acq}$ is the affine representation of the N×P GRAPPA reconstruction for the coils, where $Y_{conv}{}^{acq}$ is the convolution matrix and $Y_{fixed}{}^{acq}$ passes the acquired data through for the GRAPPA reconstruction.

When a set of ACS lines is large (unlike processing MRI image data as herein), the matrices $Y_{src}{}^{ACS}$ and $Y_{trg}{}^{ACS}$ may be prohibitive to store in memory. Alternatively, for A, B, and X, note that $$\|AX-B\|_F^2 = \operatorname{tr}(X^H A^H AX - B^H AX - X^H A^H B + B^H B), \quad (17)$$

and $$\|(A^H A)^{1/2} X - (A^H A)^{-1/2} A^H B\|_F^2 = \operatorname{tr}(X^H A^H AX - B^H AX - X^H A^H B + B^H A (A^H A)^{-1} A^H B). \quad (18)$$

Since Eqs. (17)-(18) are equal to a constant for X, the Frobenius norm in Eq. (11) may be replaced:

$$G = \underset{G}{\operatorname{argmin}} \frac{1}{N_{Fro}} \|\tilde{Y}_{src}^{ACS} G - \tilde{Y}_{trg}^{ACS}\|_F^2 + \lambda \|\Psi F^{-1} f(G, Y^{acq})\|_{1,2}, \quad (19)$$

where $\tilde{Y}_{scr}{}^{ACS} = ((Y_{src}{}^{ACS})^H Y_{src}{}^{ACS})^{1/2}$, and $\tilde{Y}_{trg}{}^{ACS} = (\tilde{Y}_{src}{}^{ACS})^{-1} (Y_{src}{}^{ACS})^H Y_{trg}{}^{ACS}$. Further $\tilde{Y}_{src}{}^{ACS}$ and $\tilde{Y}_{trg}{}^{ACS}$ replace $Y_{src}{}^{ACS}$ and $Y_{trg}{}^{ACS}$ in Eqs. (14)-(16). For $N_{fits} \gg B_y B_z P$ or $N_{fits} \gg (R_y R_z - 1)P$, these matrices are much more space efficient. However, this modification applies when $Y_{src}{}^{ACS}$ has full column rank, so $\tilde{Y}_{src}{}^{ACS}$ is invertible.

System 10 utilizes the modified GRAPPA calibration method when reconstructing a high quality image with parallel MRI data by receiving undersampled data from parallel RF receiver coil array 4 and imaging computer 17 extracts blocks of data to be used for calibration (the ACS lines). Computer 17 collects points from ACS line data for each calibration fit equation and incorporates point data into matrices $Y_{src}{}^{ACS}$ and $Y_{trg}{}^{ACS}$. In the case where there are more fit equations than GRAPPA kernel source points, computer 17 constructs matrices $\tilde{Y}_{src}{}^{ACS}$ and $\tilde{Y}_{trg}{}^{ACS}$ as previously described. Computer 17 selects a sparsifying transform $\Psi$ like a discrete wavelet transform and an initial tuning parameter value $\lambda$ to use for the acquired data. Computer 17 sets the GRAPPA kernel weights to zero and evaluates the initial value of the problem objective in Eq. (11). Computer 17 iterates until convergence and reconstructs coil images using the GRAPPA method with the current kernel weights. Computer 17 determines the sparsifying transform $W^t$ of the reconstructed coil images and updates the diagonal reweighting matrix $\Delta_{n,n}{}^t = 1/\|[W_{n,1}{}^t, \ldots, W_{n,P}{}^t, \varepsilon]\|_2$ ($\varepsilon^w = 10^{-15}$). Computer 17 in one embodiment uses a least-squares solver like LSMR to solve the linear system in Eq. (13) for updated kernel weights G. Computer 17 evaluates the current value of the objective of the optimization problem in Eq. (11) and terminates iteration if the objective decreases by less than 0.01 times the previous objective value. Computer 17 performs GRAPPA reconstruction using the final kernel weights, combines the reconstructed coil images using sum-of-squares (magnitude only) or a linear combination of the coil image data (magnitude and phase) and outputs the reconstructed combined image to a display or electronic storage device.

Figure 2B:
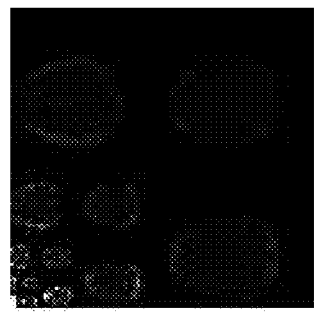
FIG. 2A shows a combined magnitude 2-D reference image and FIG. 2B shows a four-level '9-7' discrete wavelet transform (DWT) of the reference coil images, according to invention principles.
Figure 2A:
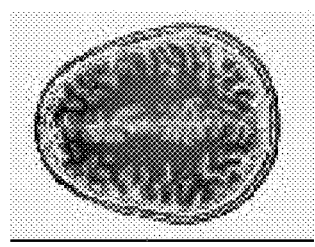

FIG. 2A shows a combined magnitude 2-D reference image and FIG. 2B shows a four-level '9-7' discrete wavelet transform (DWT) of the reference coil images. The $l_2$ norm across the coils of the sparse transform coefficients for the coil images is used in FIG. 2B. The image intensity in FIG. 2B is scaled up so that the sparse coefficient pattern is readily visible. In order to compare performance of a system 10 method to GRAPPA alone and to GRAPPA kernel calibration using Tikhonov regularization, a 3D dataset is acquired using an un-accelerated $T_1$-weighted MPRAGE sequence (256×256×176 sagittal; 1.0 mm isotropic voxels) on a Siemens Tim Trio 3 T system (Siemens Healthcare, Erlangen, Germany) using a 32-channel head-coil receive array, for a total acquisition time of 8 minutes. In addition, a noise-only acquisition (no RF excitation) is performed to estimate a coil noise covariance matrix. This noise covariance matrix is used in conjunction with low-resolution coil sensitivity estimates generated from the block of ACS lines in the center of k-space, to form SNR-optimal coil combination weights, analogous to using unaccelerated SENSE. The volume image data is inverse Fourier transformed in the axial (readout) direction, and a slice in the transverse axial plane is extracted, cropped, and undersampled in both phase-encode directions (the fully-sampled slice is retained as a gold standard for comparison). As shown in FIG. 2B, a four-level '9-7' DWT is selected as an appropriate sparsifying transform for a selected slice. Different reconstruction methods are implemented and run on this data in MATLAB (Natick, Mass.). The combined magnitude images from the reconstructions are compared visually using difference images and quantitatively using PSNR (peak signal-to-noise ratio), although PSNR does not effectively capture localized errors, such as misrepresentation of a tumor.

Multiple different comparisons are performed using different selections of size of ACS lines and source kernel, to demonstrate how regularization affects reconstruction when a number of ACS fits and the number of kernel source points varies. It is expected regularization becomes more important when the number of ACS fits is not much bigger than the number of GRAPPA source weights requiring calibration. In an example of ACS fit of decent quality without regularization, the undersampled data is spaced four k-space lines apart in both directions ($R_y=R_z=4$), and a GRAPPA kernel with source neighborhood 3×3 blocks in size is calibrated from a 36×36 Nyquist-sampled block of ACS lines. In this case, 784 ACS fits are used to calibrate 288 weights for each target set of GRAPPA kernels. The GRAPPA reconstructions using no regularization, Tikhonov regularization, and sparsity are shown in FIG. 3.

FIG. 3 shows combined magnitude and difference images acquired with a first set of acquisition parameters and generated using GRAPPA reconstruction with (a) no regularization (FIG. 3(a)), (b) Tikhonov (minimum energy) regularization (FIG. 3(b)), and (c) sparsity-promoting regularization (FIG. 3(c)). The combined magnitude and difference images are acquired for $R_y=R_z=4$ uniform undersampled data with $N_{ACS,k\ y}=N_{ACS,k\ z}=36$ ACS lines, and a $B_y=B_z=3$ size GRAPPA kernel. Both Tikhonov regularization and promoting sparsity effectively reduce the noise amplification of the GRAPPA result, achieving over 2 dB improvement in PSNR and portraying noticeably less noise in the difference images. However, the difference between regularization types is not significant in this example. In order to achieve greater differentiation, computer 17 uses a larger kernel size or fewer ACS lines, to achieve a poorer initial fit. In a further example, the kernel size is increased to cover a 4×4 block source neighborhood, increasing the number of calibrated weights per target set to 512, and decreasing the number of ACS fits to 576. The undersampling factor and number of ACS lines is kept the same as in FIG. 3. The results for GRAPPA with and without regularization are shown in FIG. 4.

FIG. 4 shows combined magnitude and difference images acquired with a second set of acquisition parameters and generated using GRAPPA reconstruction with (a) no regularization (FIG. 4(a)), (b) Tikhonov (minimum energy) regularization (FIG. 4(b)), and (c) sparsity-promoting regularization (FIG. 4(c)). The combined magnitude and difference images are acquired for $R_y=R_z=4$ uniform undersampled data with $N_{ACS,k\ y}=N_{ACS,k\ z}=36$ ACS lines, and a $B_y=B_z=4$ size GRAPPA kernel. The GRAPPA reconstruction without any regularization (FIG. 4(a) has greatly diminished in quality relative to FIG. 3(a), displaying significantly more noise amplification than previously. The addition of either type of regularization is sufficient for mitigating this increase in noise amplification, producing results of better quality than in FIG. 4(a) (due to a larger kernel). The difference between both regularizations, however, remains nearly indistinguishable.

In a further example, the number of ACS lines is reduced to a 20×20 block of ACS lines, providing only 64 ACS fit equations to calibrate 512 source points. Since there are fewer fit equations than source points, the un-regularized GRAPPA kernel calibration in Eq. (7) involves inverting a rank-deficient matrix. Thus the Tikhonov and sparsity-promoting regularization methods are compared in FIG. 5. Specifically, FIG. 5 shows combined magnitude and difference images acquired with a third set of acquisition parameters and generated using GRAPPA reconstruction with (a) Tikhonov (minimum energy) regularization (FIG. 5(a)), and (b) sparsity-promoting regularization (FIG. 5(b)). The combined magnitude and difference images are acquired for $R_y=R_z=4$ uniform undersampled data with $N_{ACS,k\ y}=N_{ACS,k\ z}=20$ ACS lines, and a $B_y=B_z=4$ size GRAPPA kernel. Unlike the image acquisition of FIG. 4, Tikhonov regularization cannot produce a GRAPPA kernel that properly un-aliases the image. However, the system 10 method of sparsity-promoting regularization calibrates a GRAPPA kernel that yields an image without significant aliasing. GRAPPA kernel calibration regularized with sparsity is more effective in the underdetermined case than GRAPPA kernel calibration using Tikhonov regularization.

System 10 regularizes a GRAPPA kernel calibration step, to advantageously improve visual quality and noise level of GRAPPA reconstruction. When the number of ACS lines suffices to calibrate the set of GRAPPA kernels, both Tikhonov and sparsity-promoting regularization effectively reduce the noise amplification due to using a GRAPPA reconstruction method. Furthermore, when the number of ACS lines is smaller than the number of source weights to be calibrated, the system 10 sparsity-promoting method yields a kernel that reconstructs an un-aliased image. Thus, in addition to de-noising, the system 10 method is effective at un-aliasing with fewer calibration lines required by GRAPPA with Tikhonov or no regularization. An image acquisition system for use with GRAPPA needs to balance the amount of undersampling with the number of ACS lines to achieve the greatest total acceleration while maintaining desired image luminance contrast and effective resolution. The use of Tikhonov regularization enables slight reduction in the amount of ACS lines necessary via de-noising and the system 10 method decreases the required number of ACS lines further. The system 10 sparsity-promoting GRAPPA kernel calibration method enables faster parallel imaging acquisition, increasing the affordability, comfort level, and capabilities of MRI.

System 10 is usable for common conventional MR image acquisitions including uniform Cartesian undersampling of k-space and is usable for nonuniform, including random, Cartesian and non-Cartesian undersampling, using desirable properties of these sampling patterns to improve reconstruction quality. For the nonuniform embodiment a joint estimation problem of the GRAPPA kernel coefficients and the un-acquired k-space is used. An alternating construction of a GRAPPA kernel and estimate of k-space consistent with that kernel and the acquired data is performed. In addition, in one embodiment a re-gridding operator is used to accommodate non-Cartesian sampling patterns like radial and spiral trajectories.

System 10 uses a single RF receiver coil array in acquiring a small block of calibration k-space data (not undersampled, but the block is a portion of an image k-space) and a set of undersampled k-space data that needs to be interpolated. The k-space data comprises a set containing data for each coil in the coil array. The system uses weights that interpolate the missing components in the undersampled set from a linear combination of nearby (in terms of frequency) k-space data points from each coil of the array. The weights in one embodiment are initially generated using a least squares fit from the calibration data. The k-space set interpolated using the weights and the undersampled k-space data has a "sparse" transform domain representation (a wavelet transform on the image domain is a suitable transformation, for example). The weights are adjusted to yield a substantially complete k-space having a transform domain representation with fewer significant coefficients. The weights are iteratively modified. The system advantageously modifies the weights instead of k-space, and maps image representative data using the weights to a reconstructed k-space as a transformation, comprising a sparsifying transform on the weights instead of just the image or the k-space for that image.

Figure 6:
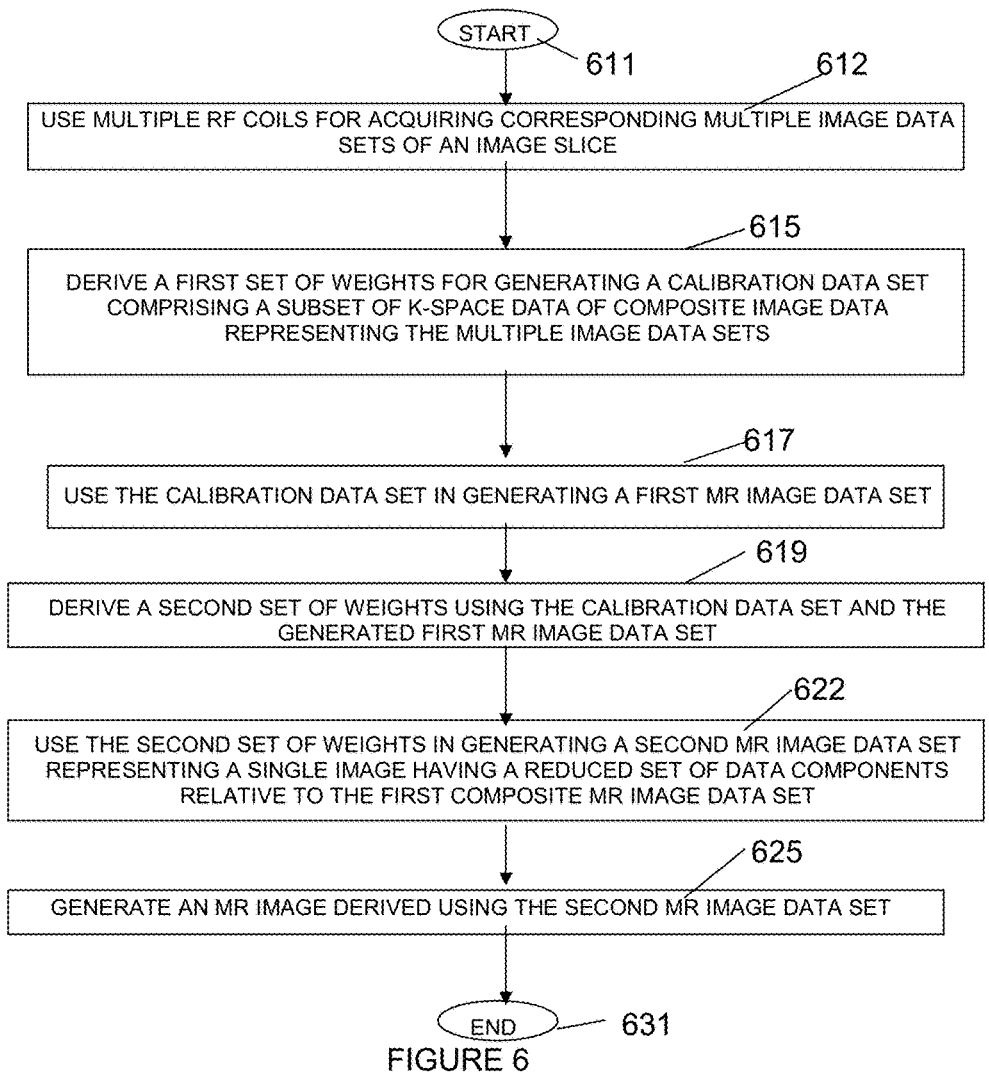
FIG. 6 shows a flowchart of a process performed by a system for parallel image processing in MR imaging, according to invention principles.

FIG. 6 shows a flowchart of a process performed by system 10 for parallel image processing in MR imaging. In step 612 following the start at step 611, system 10 uses multiple RF coils 4 for acquiring corresponding multiple image data sets of an image slice. The multiple image data sets of the slice individually comprise a reduced size block of calibration k-space data. System 10 uses RF coils 4 for acquiring corresponding multiple image data sets of the slice by using a parallel imaging method compatible with at least one of (a) SMASH (SiMultaneous Acquisition of Spatial-Harmonics) and (b) GRAPPA (Gene-Ralized Autocalibrating Partially Parallel Acquisition). In step 615, an image data processor (imaging computer 17) derives a first set of weights for generating a calibration data set comprising a subset of k-space data of composite image data representing the multiple image data sets and in step 617 uses the calibration data set in generating a first MR image data set. Computer 17 generates the first MR image data set by deriving the first set of weights using the multiple image data sets of the slice. Computer 17 generates the first MR image data set representing a single image using the first set of weights by performing a weighted combination of luminance representative data of individual corresponding pixels of the multiple image data sets in providing an individual pixel luminance value of the first MR image data set. In one embodiment, computer 17 generates the first set of weights using a fitting function to fit the acquired subset of k-space data.

In step 619, computer 17 derives a second set of weights using the calibration data set and the generated first MR image data set. Computer 17 derives the second set of weights using the calibration data set and the generated first MR image data set by reducing noise in the generated first MR image data set by generating a reduced set of significant components in a predetermined transform domain representation of data representing the first MR image data set to provide a de-noised composite MR image data set. Computer 17 derives the second set of weights using an inverse Fourier transform and a wavelet transform in iteratively converting between the weights and a wavelet representation of interpolated image data in providing a compressed sensing sparse transformation of the weights. Computer 17 in step 622 uses the second set of weights in generating a second MR image data set representing a single image having a reduced set of data components relative to the first composite MR image data set. Computer 17 uses weights to interpolate missing components in an acquired undersampled k-space data set from a linear combination of k-space data points for image data from an individual RF coil. Computer 17 derives the second set of weights so that a difference between interpolated image representative data components provided using the first and second set of weights respectively, is below a predetermined threshold and uses the weights to provide a weighted linear combination of luminance representative data of individual corresponding pixels of the multiple image data sets.

Computer 17 in step 625 generates an MR image derived using the second MR image data set by performing an image reconstruction. In one embodiment, computer 17 uses the calibration data set in generating an MR image data set and iteratively, derives a further set of weights using a generated calibration data set and a generated MR image data set and uses the further set of weights in generating another MR image data set. This generated MR image data set represents a single image having a reduced set of data components relative to a previously generated MR image data set, until difference between interpolated image representative data components provided using successive different sets of weights respectively, is below a predetermined threshold. The process of FIG. 6 terminates at step 631.

Returning to FIG. 1, RF coils 4 emit RF pulses to excite nuclear proton spins in a patient on support table 5 in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via a radio-frequency amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M. The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Transverse plane inversion occurs in the x or y direction and longitudinal plane inversion occurs in the z plane.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

Definitions.

EPI comprises Echo planar imaging involves image acquisition whereby a complete image is formed from a single data sample (k-space lines are acquired in one repetition time) of a gradient echo or spin echo sequence.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted).

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI comprises inversion time, the time between an inversion recovery pulse and the next RF excitation pulse. TI determines the image luminance contrast.

$T_1$ comprises the longitudinal (or spin-lattice) relaxation time $T_1$ decay constant.

$T_2$ comprises the transverse (or spin-spin) relaxation time $T_2$ is the decay constant for a proton spin component.

TR comprises repetition time, the time between successive RF excitation pulses.

TE (Echo Time) comprises a time period between the start of an RF pulse and the maximum in the received echo signal. The sequence is repeated every TR seconds.

B0 is the main static base MRI magnetic field.

B1 is the RF transmit coil field.

The system and processes of the FIGS. 1-6 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system uses an RF receiver coil array in acquiring a small block of calibration k-space data (not undersampled, but the block is a portion of an image k-space) and a set of undersampled k-space data that needs to be interpolated and uses weights that interpolate missing components in the undersampled data from a linear combination of nearby (in terms of frequency) k-space data points from each coil of the array. Further, the processes and applications may, in alternative embodiments, be located on one or more (e.g., distributed) processing devices on a network linking the units of FIG. 1. Any of the functions and steps provided in FIGS. 1-6 may be implemented in hardware, software or a combination of both. No claim element herein is to be construed under the provisions of 35 U.S.C. 112, sixth paragraph, unless the element is expressly recited using the phrase "means for."

What is claimed is:

1. A system for parallel image processing in MR imaging, comprising:
   a plurality of MR imaging RF coils for individually receiving MR imaging data representing a slice of patient anatomy;
   an MR imaging system for using the plurality of RF coils for acquiring a corresponding plurality of image data sets of said slice; and
   an image data processor comprising at least one processing device configured to:
      derive a first set of weights for generating a calibration data set comprising a subset of k-space data of composite image data representing said plurality of image data sets,
      generate a first MR image data set representative of the calibration data set, wherein the first MR image data set is generated by reconstructing an initial image by convolving the first set of weights with the k-space data and combining the convolved results across the plurality of image data sets;
      derive a second set of weights using said calibration data set and a sparsifying transform of the generated first MR image data set, and
      use said second set of weights to generate a second MR image data set representing a single image having a reduced set of data components relative to said first composite MR image data set.

2. A system according to claim 1, wherein said image data processor generates said first MR image data set representing a single image using said first set of weights by performing a weighted combination of luminance representative data of individual corresponding pixels of said plurality of image data sets in providing an individual pixel luminance value of said first MR image data set.

3. A system according to claim 1, wherein said image data processor derives said second set of weights using said calibration data set and the generated first MR image data set by reducing noise in said generated first MR image data set by generating a reduced set of significant components in a predetermined transform domain representation of data representing the first MR image data set to provide a de-noised composite MR image data set.

4. A system according to claim 1, wherein said image data processor derives said second set of weights using said calibration data set and the generated first MR image data set by using an inverse Fourier transform and a wavelet transform in iteratively converting between the weights and a wavelet representation of interpolated image data in providing a compressed sensing sparse transformation of the weights.

5. A system according to claim 1, wherein said image data processor generates said first MR image data set by deriving said first set of weights using said plurality of image data sets of said slice.

6. A system according to claim 1, wherein said plurality of image data sets of said slice individually comprise a reduced size block of calibration k-space data.

7. A system according to claim 1, wherein said image data processor uses weights to interpolate missing components in an acquired undersampled k-space data set from a linear combination of k-space data points for image data from an individual RF coil.

8. A system according to claim 1, wherein said image data processor generates said first set of weights using a fitting function to fit the acquired subset of k-space data.

9. A system according to claim 1, including an image generator comprising at least one processing device conditioned for generating an MR image derived using said second MR image data set.

10. A system according to claim 1, wherein said second MR image data set has a reduced set of data components comprising a data set of increased sparsity relative to said first MR image data set.

11. A system according to claim 10, wherein said reduced set of components comprise components in a predetermined transform domain representation of data representing a composite image.

12. A system according to claim 1, wherein said image data processor uses the weights to provide a weighted linear combination of luminance representative data of individual corresponding pixels of said plurality of image data sets.

13. A system according to claim 1, wherein said image data processor in generating an MR image data set performs an image reconstruction.

14. A system according to claim 1, wherein said MR imaging system uses the plurality of RF coils for acquiring a corresponding plurality of image data sets of said slice by using a parallel imaging method compatible with at least one of (a) SMASH (SiMultaneous Acquisition of SpatialHarmonics) and (b) GRAPPA (Gene-Ralized Autocalibrating Partially Parallel Acquisition).

15. A system for parallel image processing in MR imaging, comprising:
   a plurality of MR imaging RF coils for individually receiving MR imaging data representing a slice of patient anatomy;
   an MR imaging system configured to use the plurality of RF coils to acquire a corresponding plurality of image data sets of said slice; and
   an image data processor comprising at least one processing device configured to:

derive a set of weights for generating a calibration data set comprising a subset of k-space data of composite image data representing said plurality of image data sets, iteratively update the set of weights by a process until a convergence condition is satisfied, the process comprising:

using said calibration data set and the set of weights to generate an initial MR image data set, wherein the initial MR image data set is generated by reconstructing an initial image by convolving the set of weights with the k-space data and combining the convolved results across the plurality of image data sets, and updating the set of weights using a generated calibration data set and a sparsifying transform of the generated initial MR image data set; and after the convergence condition is satisfied, using said further updated set of weights in generating a further MR image data set representing a single image having a reduced set of data components relative to a previously generated initial MR image data set.

16. A method for parallel image processing in MR imaging, comprising the activities of:

using a plurality of RF coils for acquiring a corresponding plurality of image data sets of an image slice;

deriving a first set of weights for generating a calibration data set comprising a subset of k-space data of composite image data representing said plurality of image data sets;

using said calibration data set to generate a first MR image data set wherein the first MR image data set is generated by reconstructing an initial image by convolving the set of weights with the k-space data and combining the convolved results across the plurality of image data sets;

updating the set of weights using said calibration data set and a sparsifying transform of the generated first MR image data set; and using said updated set of weights to generate a second MR image data set representing a single image having a reduced set of data components relative to said first MR image data set.

17. A method according to claim 16, including the activity of:

generating said first MR image data set representing a single image using said first set of weights by performing a weighted combination of luminance representative data of individual corresponding pixels of said plurality of image data sets in providing an individual pixel luminance value of said first MR image data set.

18. A method for parallel image processing in MR imaging, comprising the activities of:

using a plurality of RF coils for acquiring a corresponding plurality of image data sets of an image slice;

deriving a set of weights for generating a calibration data set comprising a subset of k-space data of composite image data representing said plurality of image data sets;

iteratively updating the set of weights by a process until a convergence condition is satisfied, the process comprising:

using said calibration data set to generate an initial MR image data set, wherein the initial MR image data set is generated by reconstructing an initial image by convolving the set of weights with the k-space data and combining the convolved results across the plurality of image data sets, and updating the set of weights using a generated calibration data set and a sparsifying transform of the generated initial MR image data set; and after the convergence condition is satisfied, using said updated set of weights in generating a further MR image data set representing a single image having a reduced set of data components relative to a previously generated initial MR image data set.

* * * * *